United States Patent [19]

Dillon et al.

[11] Patent Number: 5,062,930
[45] Date of Patent: Nov. 5, 1991

[54] ELECTROLYTIC PERMANGANATE GENERATION

[75] Inventors: John R. Dillon, Warwickshire; James D. O'Connor, Coventry, both of England

[73] Assignee: Shipley Company Inc., Newton, Mass.

[21] Appl. No.: 557,623

[22] Filed: Jul. 24, 1990

[51] Int. Cl.$^5$ .............................................. C25B 1/28
[52] U.S. Cl. ..................................... 204/82; 156/625; 156/642; 204/86; 204/130; 204/290 R; 204/291; 204/292
[58] Field of Search ................ 156/625, 642; 423/599; 204/82, 86, 130, 290 R, 291, 292

[56] References Cited

U.S. PATENT DOCUMENTS

| | | | |
|---|---|---|---|
| 2,843,537 | 7/1958 | Carus | 204/82 |
| 2,908,620 | 10/1959 | Carus | 204/82 |
| 3,652,351 | 3/1972 | Guisti | 204/30 |
| 4,273,642 | 6/1981 | Seilo | 204/286 |
| 4,425,380 | 1/1984 | Nuzzi et al. | 156/668 |
| 4,515,829 | 5/1985 | Deckert et al. | 156/668 |
| 4,555,317 | 11/1985 | Nicolas et al. | 204/120 |
| 4,592,852 | 6/1986 | Courduvelis et al. | 156/642 |
| 4,629,636 | 12/1986 | Courduvelis et al. | 156/642 |
| 4,698,124 | 10/1987 | Krulik | 156/642 |
| 4,853,095 | 8/1989 | D'Ambrisi | 204/82 |
| 4,859,300 | 8/1989 | Sullivan et al. | 204/164 |

OTHER PUBLICATIONS

"Manganese Compounds", Kirk-Othmer Encyclopedia of Chemical Technical, John Wiley and Sons, vol. 14, pp. 871 ∝ 877, 1981.

*Primary Examiner*—John Niebling
*Assistant Examiner*—David G. Ryser
*Attorney, Agent, or Firm*—Robert L. Goldberg

[57] ABSTRACT

Method and apparatus for electrolytic generation of permanganate. The invention includes a manganese dioxide adherent cathode surface which eliminates undesirable reduction reactions at the cathode during electrolysis thereby increasing permanganate generation efficiency.

16 Claims, 1 Drawing Sheet

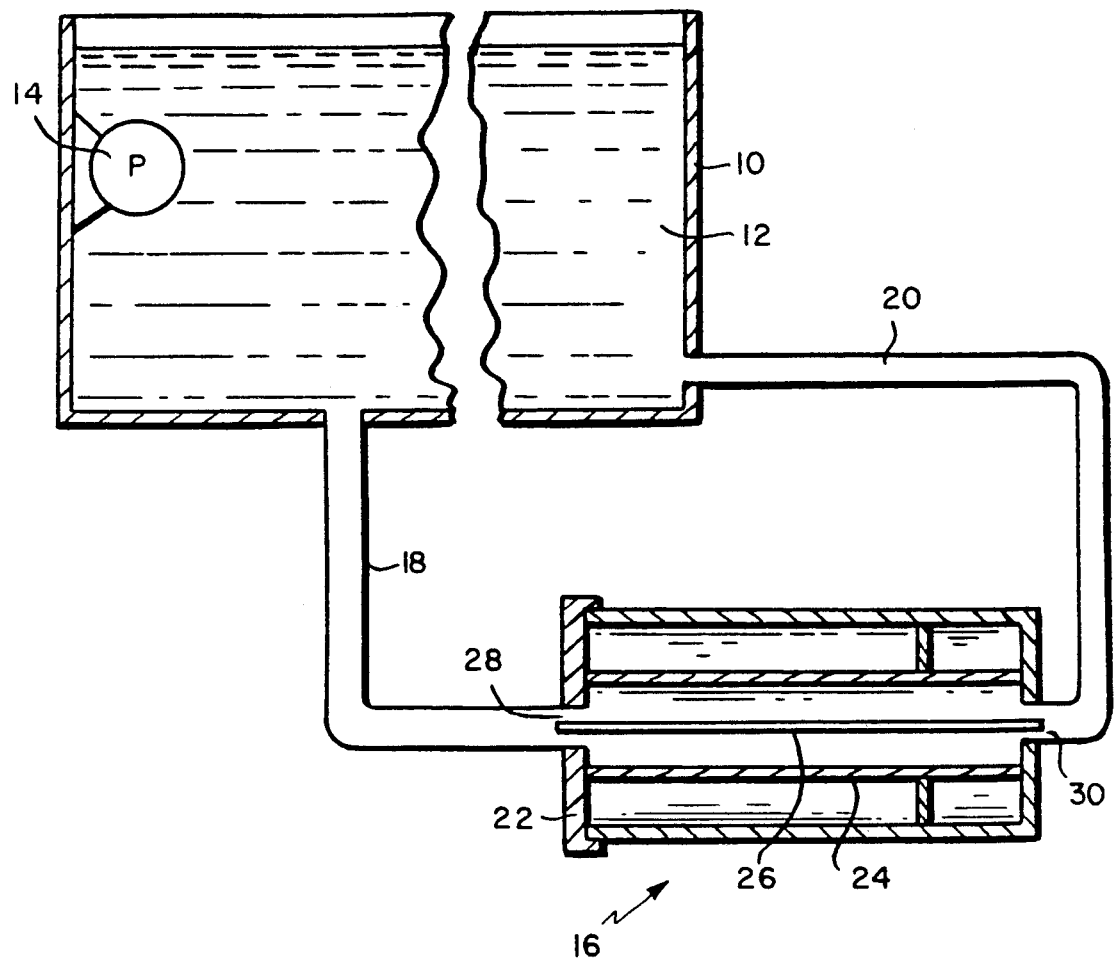

ELECTROLYTIC PERMANGANATE GENERATION

BACKGROUND OF THE INVENTION

1. Introduction

This invention relates to a process and apparatus for generating permanganate through electrolytic oxidation. In particular, the invention relates to electrolytic regeneration of permanganate etchant baths.

2. Description of the prior art

Electroless metal plating of plastic substrates is employed to produce a variety of items such as printed electronic circuit boards and electromagnetic interference shielding. Prior to metal deposition, the plastic substrate is etched by an oxidant to enhance adhesion of the metal. This is often an essential step to a successful plating sequence. For example, conductive through-holes of printed circuit boards have posed persistent problems to metal plating which have been addressed through an oxidative etching process, as described in U.S. Pat. No. 4,515,829, incorporated herein by reference.

A variety of oxidant etching agents have been employed. Chromium compounds and concentrated sulfuric acid are less favored due to problems associated with application, safety and disposal. Much more convenient are the widely used permanganate solutions, particularly alkaline permanganate solutions.

The operating life of a permanganate etchant bath can be relatively limited as permanganate ions are reduced during the etching process to manganese species of lower oxidative states, such as manages dioxide and manganate. This reduction results directly from the etching process as well as from the etchant bath conditions; for instance, the alkaline bath promotes permanganate disproportionation to yield manganate. As it is permanganate rather than the lower oxidative state manganese species which exhibit polymer etching properties, to maintain etchant activity the bath must either be regularly replaced with fresh permangante solution or supplemented with additional permanganate ions. Preferably, permanganate concentration is maintained by oxidation of reduced manganese species present in the bath as addition of new permanganate to an existing bath or bath replacement are both expensive and burdensome.

A convenient means of permanganate regeneration is oxidative electrolysis, as generally described in U.S. Pat. No. 4,859,300, incorporated herein by reference. The efficiency of such electrolysis has been limited by reduction reactions occurring at the cathode, specifically the reduction of permanganate and lower oxidative state manganese compounds. Reduction yielding manganese dioxide particularly limits cell efficiency. Manganese dioxide is extremely insoluble in typical etching solutions and thus, once formed, cannot be oxidized at the anode to permanganate.

This problem is commonly addressed by use of a high anode surface area to cathode surface area ratio. However, a high electrode surface area ratio only limits, and does not eliminate, cathode reduction reactions. Furthermore, use of a high electrode surface area ratio can be burdensome where a relatively compact cell is required, for example if permanganate regeneration is performed in situ by placement of the cell within the etchant bath vessel.

A separated-type cell also has been employed to limit undesirable cathode reduction reactions. In this type of cell the cathode is separated from the anode by a porous membrane which restricts migration of permanganate ions to the cathode. However this system tends to be inconvenient. Manganese dioxide is produced through permanganate decay in the solution and as noted is virtually insoluble in the etchant solution. The insoluble manganese dioxide collects throughout the separated cell and particularly on the porous membrane separating the anode and cathode. The membrane consequently becomes blocked, preventing electricity flow through the cell. Regular cell disassembly and cleaning are required to maintain cell efficiency.

SUMMARY OF THE INVENTION

The present invention comprises an improved method and apparatus for electrolytic generation of permanganate. The invention provides more efficient and convenient permanganate generation than afforded by prior systems. Although generally discussed in the context of permanganate generation, and specifically regeneration of permanganate etchant solutions, the present invention should be applicable to electrolytic oxidation in other technologies and particularly other technologies employing permanganate solutions.

In one embodiment, the invention is a process for permanganate generation through electrolytic oxidation of one or more manganese compounds in an aqueous solution, comprising the steps of contacting an anode and a cathode with the aqueous solution and subjecting the solution to electrolysis. The cathode may be of a variety of conductive materials and has a surface deposit that is adherent to manganese dioxide during electrolysis covering at least a portion of the cathode surface. During electrolysis manganese dioxide in the solution adheres to the cathode surface deposit forming a film thereon. This manganese dioxide film completely or at least virtually eliminates undesired reduction reactions at the cathode and thereby substantially increases permanganate generation efficiency.

In another embodiment, the invention is an electrolytic cell for permanganate generation by electrolytic oxidation of one or more manganese compounds in a aqueous solution. The cell comprises an anode and cathode of the above-described type. During electrolysis of a permanganate etchant solution, a manganese dioxide film forms on the cathode surface deposit affording the noted advantages thereof.

BRIEF DESCRIPTION OF THE DRAWING

A more complete understanding of the invention may be provided by reference to the accompanying drawing wherein:

The FIGURE is a cross-sectional representation of the present invention.

DESCRIPTION OF THE PREFERRED EMBODIMENTS

The anode electrode of the present invention can be of any suitable conductive and corrosion resistant material and preferably is nickel or a nickel alloy, such as the nickel-copper alloy Monel. The anode preferably has an electrical conductivity of at least about 51 microhms/cm. at 20° C., and is constructed of expanded metal plate with some type of punched holes or other openings to maximize the electrode's surface area. A preferred material of construction is Monel mesh of thickness between 0.5 and 1.0 mm. and mesh openings of between 1.5 to 4.0 mm.

The cathode electrode comprises a conductive metal on which is deposited a composition that is adherent to manganese dioxide during electrolysis. The cathode conductive metal core may be any suitable conductive material such as copper, stainless steel or titanium, with copper being preferred for its conductivity. Nickel is preferably used as the composition adherent to manganese dioxide. It is believed that other conductive compounds could serve as suitable manganese dioxide adherent compositions. The cathode deposit is applied by either electroless deposition or bright nickel electroplating using standard procedures, for example those procedures described in L. J. Durney, Electroplating Engineering Handbook, pp. 174-184 and 453 (4th ed. 1984); and The Canning Handbook of Surface Finishing Technology, ch. 13 (23rd ed., E & F N Spon), both incorporated herein by reference.

Nickel is deposited on the cathode to a thickness of between about 3 to 30 microns, preferably between about 5 to 15 microns. This cathode deposit preferably covers the entire surface of the cathode that contacts the etchant bath. However, significant increases in permanganate generation efficiency also should be realized where a lesser amount of the cathode is covered with the manganese dioxide adherent surface deposit, for example where at least about 25 percent of the cathode surface contacting the etchant bath is covered by the surface deposit.

During electrolysis of a permanganate etchant solution, manganese dioxide adheres to the cathode surface deposit providing a manganese dioxide film thereon of thickness of between about 0.5 to 5.0 mm. It has been found that this manganese dioxide layer completely or at least virtually eliminates undesired reduction reactions occurring at the cathode and thereby substantially increases permanganate yields. As the only $MnO_2$ produced is through permanganate decay in the alkaline solution, the present invention produces much less $MnO_2$ than a similar system that lacks a manganese dioxide adherent cathode surface deposit. Additionally, unlike separation-type cells having membranes that readily clog with manganese dioxide, the presence of $MnO_2$ does not disrupt the operation of the cell of the present invention.

While the manganese dioxide layer does not appreciably impede oxidation reactions occuring at the anode, cell voltage may be increased during the course of the electrolysis. If a portion of the manganese dioxide coating is for any reason dislodged from the cathode surface, it is immediately replaced through adherence of manganese dioxide present in the solution or generated through permanganate reduction.

Though not wishing to be bound by theory, it is believed the adhesion of manganese dioxide to the nickel plated cathode is due at least in part to the cleaning of the nickel surface by hydrogen liberated through $H_2O$ reduction.

The etchant solution is an aqueous solution having a permanganate concentration of between about 10 to 100 grams per liter and preferably between about 20 and 50 grams per liter, and a hydroxide concentration to provide a pH of at least about 10, and preferably a hydroxide concentration of about 1.2 normal in hydroxide to provide a pH of at least about 13. Any metal salt of permanganate that is sufficiently stable and soluble can be used, but preferred are alkali metal salts such as sodium, potassium, litium or cesium, or an alkaline earth metal salt, for example a salt of calcium. Especially preferred are sodium and potassium permanganates because of availability and relatively low costs. Similarly, a variety of hydroxide salts may be employed, but sodium and potassium hydroxide are preferred for reasons of availability and cost. The etchant solution may also include suitable buffers to increase peel strength such as phosphates, borates and carbonates as well as wetting agents to improve the wettability of the etchant solution.

The etchant bath is agitated in the etchant bath vessel during use to avoid layering. In the case of an in situ cell system, agitation of the etchant bath also ensures flow of reduced manganese species to the anode. Any suitable means of agitation may be employed such as one or more air pumps or mechanical stirrers. In the external cell system depicted in the FIGURE, the solution flow through the cell ensures reduced manganese species will contact the anode. The temperature of the etchant bath is generally maintained at 65° to 90° C., preferably at 80° to 85° C. However, temperatures above and below those ranges may be employed.

Cell voltage at which the etchant solution is electrolytically oxidized may vary widely and is generally between about 1 to 20 volts, and preferably is between about 4 to 5 volts. If voltage is increased during cell operation, it is generally increased between about 0.1 and 0.5 volts. Anode current densities are generally between about 212 and 850 amps per square meter, and preferably between about 425 and 640 amps per square meter. Cathode current densities are generally between about 2,000 and 8,000 amps per square meter, and preferably between about 4,000 and 6,000 amps per square meter.

The flow of the etchant solution past the cathode is preferably less than a rate where the manganese dioxide coating is regularly dislodged from the cathode surface by the force of the moving solution. If the solution flow is of a higher rate, permanganate could be reduced at the cathode until additional manganese dioxide adhered to the dislodged portion. In the cell depicted in the FIGURE, the solution flow rate through the cell is generally less than about 2.0 liters per minute, preferably is less than about 1.5 liters per minute, and most preferably about 1.0 liters per minute, although it is clear that acceptable flow rates will vary with cell design.

The present invention is advantageously employed in the manufacturing process of printed circuit boards. Such a manufacturing process is generally described in U.S. Pat. No. 4,515,829, incorporated herein by reference. The present invention can be used directly within a vessel containing etchant bath to provide in situ regeneration or can be used externally to the etchant bath vessel as depicted in the FIGURE.

Referring now to the FIGURE, which shows the present invention as utilized in a preferred fashion to etch printed circuit boards, a etchant solution tank 10 contains etchant solution 12 which is agitated by pump 14. Printed circuit boards (not shown) are immersed in tank 10 for etching. Tank 10 communicates with external electrolytic cell unit 16 by inlet pipe 18 and outlet pipe 20. Unit 16 comprises cell housing 22 within which anode electrode 24 and cathode electrode 26 are positioned. Cell housing 22 has an inlet opening 28 at one end communicating with pipe 18 and an outlet opening 30 at the other end communicating with outlet pipe 20.

Anode 24 is a cylindrical tube extending the length of cell housing 22. Cathode 26 is concentrically positioned along the axis of anode 24. To generate permanganate, solution 12 is introduced to the cell by means of a circulating pump (not shown) through pipe 18, passed through the cell and subjected to electrolysis therein, and then returned to tank 10 by outlet pipe 20. Oxidation may be conducted while circuit boards are being etched in vessel 10 or at any other time.

The invention will be better understood by reference to the following examples. As shown by the superior permanganate yield realized in Example 2 relative to the yield of Example 3, the present invention provides a substantially more efficient means of permanganate generation than afforded by prior systems.

EXAMPLE 1

A copper cathode of 50 cm. length and 1 cm. diameter was cleaned in a 10% aqueous solution of Neutraclean 68 (Shipley Company) at 50° C. for 5 minutes. The cathode was rinsed in deionized water and then etched using Preposit etch 748 (Shipley Company) at room temperature for 2 minutes. After etching, the cathode was rinsed in deionized water and then completely immersed in a Niposit 65 electroless nickel plating bath (Shipley Company) heated to 90° C. The cathode was contacted with a steel bar to initiate deposition. After 1 hour, the cathode was removed from the bath having a nickel surface deposit thereon of approximately 10 microns.

EXAMPLE 2

A stainless steel tank was charged with 45 liters of deionized water containing 65 g/l $KMnO_4$ and 40 g/l NaOH. The solution was circulated in the tank with an air pump and heated to 80° C. An electrolytic cell unit of the type depicted in the FIGURE was connected to the tank by stainless steel piping. The cell unit included a cell housing of 50 cm. length and 11 cm. diameter. The cell housing had an inlet opening at one end and an outlet opening at another end to provide means for passing the alkaline solution through the cell. Within the cell housing was placed a cylindrical Monel mesh anode electrode of 50 cm. length and 8 cm. diameter. The Monel mesh was of mesh size no. 12, i.e. 12 holes per inch. A tubular copper cathode electrode of 50 cm. length and 1 cm. diameter was concentrically placed along the axis of the anode. The copper cathode had a nickel surface deposit applied by the procedure of Example 1.

For a two hour period, the heated alkaline solution was continuously withdrawn from the tank with a circulating pump, passed through the electrolytic cell at a rate of 1.0 liters per minute with the cell operated at 50 amps and 4.5 volts. Formation of a manganese dioxide film on the cathode was observed immediately upon the start of electrolysis. At the end of the two hour period, the manganese dioxide film increased to a thickness of 1 mm. and completely covered the cathode surface.

Solution flow through the cell was terminated after this two hour period, and 3 ml/l of a glycol ether was added to the solution to reduce a portion of the $KMnO_4$. After thorough mixing, a sample of the alkaline solution was removed and spectrophotometric analysis showed concentrations of 15 g/l $KMnO_4$ and 50 g/l $K_2MnO_4$. The solution was then again passed through the external cell at a rate of 1.0 liters per minute and subjected to electrolysis at 50 amps and 4.5 volts for six hours. At the end of this six hour period, spectrophotometric analysis of a sample of the alkaline solution showed concentrations of 45 g/l $KMnO_4$ and 20 g/l $K_2MnO_4$. This represents a 61% Faradaic efficiency based on the reaction:

$$K_2MnO_4 \rightarrow KMnO_4 + K^+ + e^- \quad (I)$$

This yield does not reflect the decay of potassium permanganate which takes place at the solution operating temperature.

EXAMPLE 3

The procedure of Example 2 was repeated, but the cathode did not have a manganese adherent surface deposit. Spectrophotometric analysis of a sample of the alkaline solution at the end of the six hour period of electrolysis showed a 45% Faradaic efficiency based on the above-noted reaction (I) of manganate to permanganate.

The foregoing description of the present invention is merely illustrative thereof, and it is understood that variations and modifications can be effected without departing from the spirit or scope of the invention as set forth in the following claims.

We claim:

1. A process for permanganate generation by electrolytic oxidization of one or more manganese compounds in a solution, comprising the steps of:
   (a) contacting an anode and a cathode with the solution, the cathode having a surface deposit being adherent to manganese dioxide during electrolysis of the solution; and
   (b) subjecting the solution to electrolysis.

2. The process of claim 1 where the cathode surface deposit covers about the entire cathode surface area contacting the solution.

3. The process of claim 1 where the cathode surface deposit covers at least about 25 percent of the cathode surface area that contacts the solution.

4. The process of claim 1 where the cathode surface deposit is nickel.

5. The process of claim 1 where the cathode surface deposit is between about 3 to 30 microns thick.

6. The process of claim 1 where the cathode surface deposit is between about 5 to 15 microns thick.

7. The process of claim 1 where the cathode is made of copper.

8. The process of claim 1 where the solution is an aqueous alkaline solution.

9. The process of claim 1 used for the manufacture of a printed circuit board.

10. A process for permanganate generation by electrolytic oxidation, comprising steps of:
    (a) contacting an anode and cathode with a solution comprising one or more manganese compounds, at least portions of the surface of the cathode being comprised of nickel; and
    (b) subjecting the solution to electrolysis.

11. The process of claim 10 where about the entire cathode surface area that contacts the solution is comprised of nickel.

12. The process of claim 10 where at least about 25 percent of the cathode surface area that contacts the solution is comprised of nickel.

13. The process of claim 10 used for the manufacture of a printed circuit board.

14. A system for permanganate generation, comprising:

(a) a volume of an aqueous solution comprising one or more manganese compounds; and (b) an anode and cathode contacting the solution, at least portions of the surface of the cathode comprising a compound adherent to manganese dioxide during electrolysis of the solution.

15. The system of claim 14 where the manganese dioxide adherent compound is nickel.

16. The system of claim 14 where cathode core is copper.

* * * * *